United States Patent
Simon et al.

(10) Patent No.: US 10,177,091 B2
(45) Date of Patent: Jan. 8, 2019

(54) INTERCONNECT STRUCTURE AND METHOD OF FORMING

(71) Applicant: GLOBALFOUNDRIES INC., Grand Cayman (KY)

(72) Inventors: Andrew H. Simon, Fishkill, NY (US); Chih-Chao Yang, Glenmont, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/048,114

(22) Filed: Feb. 19, 2016

(65) Prior Publication Data

US 2017/0243827 A1    Aug. 24, 2017

(51) Int. Cl.
*H01L 23/532* (2006.01)
*H01L 21/768* (2006.01)
*H01L 21/311* (2006.01)
*H01L 21/02* (2006.01)

(52) U.S. Cl.
CPC .. *H01L 23/53238* (2013.01); *H01L 21/02063* (2013.01); *H01L 21/02247* (2013.01); *H01L 21/31111* (2013.01); *H01L 21/7684* (2013.01); *H01L 21/76802* (2013.01); *H01L 21/76826* (2013.01); *H01L 21/76828* (2013.01); *H01L 21/76843* (2013.01); *H01L 21/76877* (2013.01); *H01L 21/02252* (2013.01); *H01L 21/02255* (2013.01)

(58) Field of Classification Search
CPC ......... H01L 23/53238; H01L 21/02063; H01L 21/02247; H01L 21/31111; H01L 21/76802; H01L 21/76826; H01L 21/76828; H01L 21/7684; H01L 21/76877; H01L 23/528; H01L 23/5329; H01L 21/02252; H01L 21/02255
See application file for complete search history.

(56) References Cited

U.S. PATENT DOCUMENTS

| | | |
|---|---|---|
| 6,491,978 B1 | 12/2002 | Kalyanam |
| 6,528,180 B1 | 3/2003 | Lee et al. |
| 6,680,538 B2 | 1/2004 | Kim et al. |
| 6,736,701 B1 | 5/2004 | Shue et al. |
| 6,783,868 B2 | 8/2004 | Ciotti et al. |
| 6,910,947 B2 | 6/2005 | Paik |
| 6,913,938 B2 | 7/2005 | Shanmugasundram et al. |
| 6,919,636 B1 | 7/2005 | Ryan |
| 6,936,843 B2 | 8/2005 | Cui |
| 6,950,716 B2 | 9/2005 | Ward et al. |
| 6,952,052 B1 | 10/2005 | Marathe et al. |

(Continued)

*Primary Examiner* — Fernando L Toledo
*Assistant Examiner* — Neil Prasad
(74) *Attorney, Agent, or Firm* — Anthony Canale; Hoffman Warnick LLC (57) ABSTRACT

Aspects of the present disclosure include a method of forming a semiconductor interconnect structure and the interconnect structure. The method includes etching an opening in a first interconnect dielectric material. The method includes performing a nitridation process that converts the surfaces of the opening into nitride residues, and forms a nitrided interconnect dielectric material surface in the opening. The method includes depositing tantalum to create a tantalum layer on the nitrided interconnect dielectric surface region. The method includes depositing copper to fill the opening and planarizing the surface of the first dielectric material.

20 Claims, 6 Drawing Sheets

(56) References Cited

U.S. PATENT DOCUMENTS

| | | |
|---|---|---|
| 6,961,626 B1 | 11/2005 | Paik |
| 6,984,198 B2 | 1/2006 | Krishnamurthy et al. |
| 6,999,836 B2 | 2/2006 | Schwarm et al. |
| 7,040,956 B2 | 5/2006 | Paik |
| 7,069,101 B1 | 6/2006 | Arackaparambil et al. |
| 7,082,345 B2 | 7/2006 | Shanmugasundram et al. |
| 7,272,459 B2 | 9/2007 | Kokotov et al. |
| 7,333,871 B2 | 2/2008 | Schwarm |
| 7,337,019 B2 | 2/2008 | Reiss et al. |
| 7,349,753 B2 | 3/2008 | Pail |
| 7,354,332 B2 | 4/2008 | Surana et al. |
| 2005/0224979 A1* | 10/2005 | Marathe ............ H01L 21/76846 257/758 |
| 2006/0244087 A1* | 11/2006 | You .................... H01L 27/14623 257/432 |
| 2008/0311718 A1* | 12/2008 | Futase ................ C23C 16/0281 438/296 |
| 2012/0086064 A1* | 4/2012 | Cheng .................... H01L 21/84 257/301 |
| 2014/0287577 A1* | 9/2014 | Emesh .............. H01L 21/76879 438/618 |
| 2015/0115398 A1* | 4/2015 | Lee .................... H01L 21/7682 257/522 |

\* cited by examiner

INTERCONNECT STRUCTURE AND METHOD OF FORMING

FIELD OF THE INVENTION

The present application relates to a semiconductor structure and a method of forming the same. More particularly, the present application relates to an interconnect structure having improved reliability and a method of forming the same.

BACKGROUND

Conventional semiconductor devices typically are made up of a semiconductor substrate, normally a monocrystalline silicon with a plurality of dielectric and conductive layers formed on it. An integrated circuit (IC) is formed of semiconductor devices connected by a set of spaced-apart conductive lines and associated interconnection lines, such as bus lines, word lines and logic interconnection lines. Such interconnection lines generally constitute a limiting factor in terms of various functional characteristics of the integrated circuit.

Many interconnection lines are copper or copper-based alloys. One drawback of using copper or copper based alloys, for example, is that copper readily diffuses through silicon dioxide, the typical dielectric material employed in the manufacture of semiconductor devices.

A suitable conductive barrier layer is needed between the copper interconnection lines and both the surrounding dielectric and any other metallic contacts it might make. Such a barrier layer can be conveniently formed by employing a material that is substantially impervious to the diffusion of impurities into the copper interconnection lines and to the diffusion of copper atoms into the dielectric or nearby metal contacts. In the copper interconnection processes, conventional tantalum nitride (TaN) is the most commonly used conductive barrier material. The use of TaN requires additional deposition chambers because the deposition of TaN cannot be performed using the same deposition chamber as one with a pure metal. The need for additional deposition chambers for TaN deposition undesirably increases the cost and process complexity for the production of semiconductor devices.

BRIEF SUMMARY

A first embodiment of the present disclosure provides a method of forming a semiconductor interconnect structure. The method includes etching an opening in a first interconnect dielectric material. The method includes performing a nitridation process that converts surfaces of the opening of the first dielectric material into nitrided residues, and forms a nitrided interconnect dielectric material surface in the opening. The method includes depositing tantalum to create a tantalum layer on the nitrided interconnect dielectric surface region. The method includes depositing copper to fill the opening and planarizing a surface of the first dielectric material.

A second embodiment of the present disclosure provides an interconnect structure that includes an interconnect dielectric material over a substrate and at least one trench interconnect dielectric layer. The interconnect structure includes a nitride layer disposed on sidewalls and bottom wall of the at least one trench. The interconnect structure includes a conductive layer disposed nitride layer and a conductive wire filling at least one trench.

A third embodiment of the present disclosure provides an interconnect structure that includes an interconnect dielectric material over a substrate, the substrate having an electronic device disposed therein. The interconnect structure includes at least one trench interconnect dielectric layer, the trench exposing a surface of the electronic device. A nitride layer is disposed on sidewalls of the trench. The interconnect structure includes a tantalum layer disposed on the nitride layer and the surface of the electronic device. A copper wire fills the at least one trench.

BRIEF DESCRIPTION OF THE DRAWINGS

These and other features of this disclosure will be more readily understood from the following detailed description of the various aspects of the invention taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure will now be described by reference to the accompanying figures. In the figures, various aspects of the structures have been shown and schematically represented in a simplified manner to more clearly describe and illustrate the disclosure. For example, the figures are not intended to be drawn to scale. In addition, the vertical cross-sections of the various aspects of the structures are illustrated as being rectangular in shape. Those skilled in the art will appreciate, however, that with practical structures these aspects will most likely incorporate more tapered features. Moreover, the disclosure is not limited to constructions of any particular shape.

Resistance of wires or vias in integrated circuits has become an issue as IC's have become smaller. In an interconnect structure having a copper wire or via, a liner or diffusion barrier is required to prevent diffusion of copper atoms into the surrounding dielectric material. During interconnect fabrication, a pre-clean process is always required prior to metallization in order to remove copper oxide and control contact resistance. The pre-clean process and the deposition of tantalum nitride (TaN) are conducted in separate chambers. This requires the step of removing the semiconductor device from the pre-clean chamber and transferring it to a deposition chamber. Eliminating the transfer makes manufacturing of interconnect structures more efficient.

Figure 1:
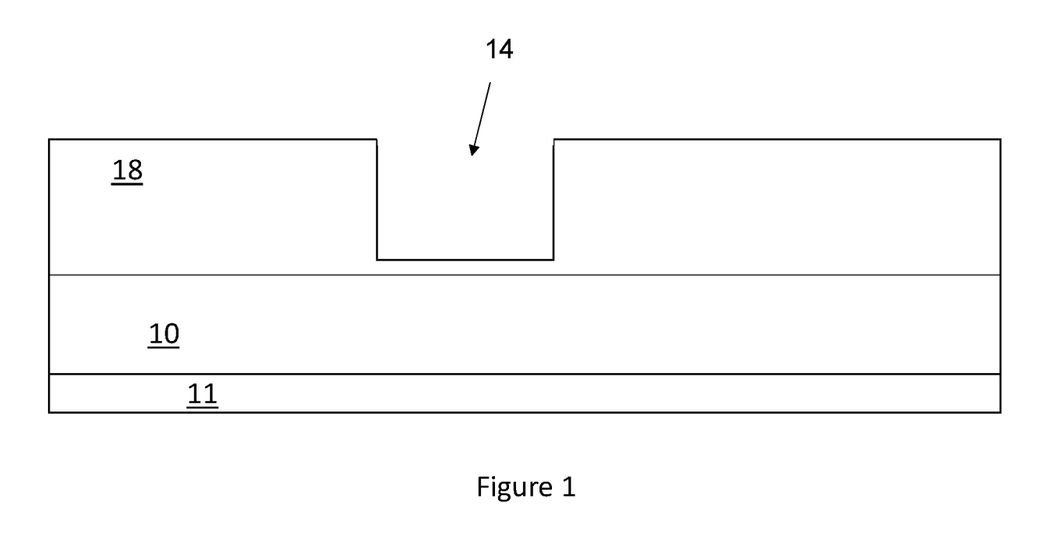
FIG. 1 illustrates a cross-sectional view of embodiments of a method for forming the electronic device shown in FIG. 4.

Referring first to FIG. 1, there is illustrated a structure including a dielectric material layer 18 having an opening 14 in a surface thereof. FIG. 1 is for illustration of the method described herein. The embodiment shown in FIG. 1 is shows the dielectric material 18 on a second layer 10. Layer 10 may include but is not limited to: a second dielectric layer, a semiconductor, a metal layer etc. That is, layer 10 may include a semiconducting material, an insulating material, a conductive material or any combination including multilayers thereof. In embodiments, the structure is disposed on a substrate 11.

The substrate 11 may be any semiconductor such as Si, SiGe, SiGeC, SiC, Ge alloys, GaAs, InAs, InP and other III/V or II/VI compound semiconductors may be used. In addition to these listed types of semiconducting materials, the present application also contemplates cases in which the semiconductor substrate is a layered semiconductor such as, for example, Si/SiGe, Si/SiC, silicon-on-insulators (SOIs) or silicon germanium-on-insulators (SGOIs). When layer 10 comprises a semiconductor, one or more semiconductor devices such as, for example, complementary metal oxide semiconductor (CMOS) devices can be fabricated thereon.

When the layer 10 is an insulating material, the insulating material can be an organic insulator, an inorganic insulator or a combination thereof including multilayers. When the layer 10 is a conducting material, the layer 10 may include, for example, doped polySi, an elemental metal, alloys of elemental metals, a metal silicide, a metal nitride or combinations thereof including multilayers. When the layer 10 comprises a combination of an insulating material and a conductive material, the layer 10 may represent a lower interconnect level of a multilayered interconnect structure.

Dielectric materials of layer 10 may include any interlevel or intralevel dielectric material including inorganic dielectric materials, organic dielectric materials, or combinations thereof. Suitable dielectric materials include carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Novellus). An example of an HSQ material is FOx™ (available from Dow Corning). For this embodiment, preferred dielectric materials are organic polymeric thermoset materials, consisting essentially of carbon, oxygen and hydrogen. Preferred dielectric materials include the low-k polyarylene ether polymeric material known as SiLK™ (available from The Dow Chemical Company), and the low-k polymeric material known as FLARE™ (available from Honeywell).

Dielectric materials may be porous, non-porous or contain regions and/or surfaces that are porous and other regions and/or surfaces that may be non-porous. Some examples of suitable dielectrics that can be used may include, but are not limited to, silicon oxide, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In some embodiments of the present disclosure, dielectric materials have a dielectric constant that is about 3.0 or less, with a dielectric constant of about 2.8 or less being even more typical. As used herein, "about" or "approximately" indicate +/−10% of the value(s) stated. All dielectric constants mentioned herein are relative to a vacuum, unless otherwise noted. Dielectric materials that have dielectric constants of about 3.0 or less generally have a lower parasitic cross talk as compared with dielectric materials that have a higher dielectric constant than 4.0. The thickness of first dielectric material 18 and the layer, when layer 10 is provided as a second dielectric material, may vary depending upon the dielectric material used as well as the exact number of dielectric layers within the interconnect structure of FIG. 1. In one embodiment, and by way of an example, first dielectric material 18 may have a thickness from about 50 nm to about 1000 nm.

The at least one opening 14 may include a via opening, a line opening, a combined via and line opening, or any combination thereof, and may be formed as substantially cylindrical opening or as a trench with an elongated dimension. In FIG. 1, one opening is shown by way of a non-limiting example. In some embodiments, a single opening can be formed. In other embodiments, a plurality (i.e., greater than 1) of openings can be formed. In some embodiments of the present disclosure, the opening 14 may extend a same depth into layer 18. In other embodiments, a first set of openings may extend to a first depth into layer 18, and a second set of openings may extend to a second depth into layer 18, wherein the second depth is different (less than or greater than) the first depth. Other depth scenarios are also possible and thus the present application is not limited to any specific depth or depths that opening 14 can extend into first dielectric material 18.

Opening(s) 14 may be formed through lithographically patterning and etching prior to deposition of a metal in opening(s) 14, as will be described herein. In lithography (or "photolithography"), a radiation sensitive "resist" coating is formed over one or more layers which are to be treated, in some manner, such as to be selectively doped and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching, for example, etching generally refers to the removal of material from a substrate (or structures formed on the substrate), and is often performed with a mask in place so that material may selectively be removed from certain areas of the substrate, while leaving the material unaffected, in other areas of the substrate.

There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features.

A pre-clean process or cleaning process can be performed prior to the formation of opening 14, after the formation of opening 14 or both. The pre-clean process or cleaning process is intended to remove native oxides from exposed metal surfaces, and other contaminants as well. The pre-clean process can include one or more of the following process steps: 1. A plasma treatment using hydrogen gas ($H_2$), in which the active species might include H (atomic hydrogen) or H+ (hydrogen ions). The hydrogen may be diluted by a carrier gas such as He, Ar, $N_2$, etc. 2. A thermal treatment with $H_2$ for thermal reduction of native oxides. 3. A sputter-etch process involving an noble gas ions such as Ar+, He+, Ne+ for physical sputtering of interfacial contaminants and native oxides. The pre-clean process may be performed either before or after the nitridation process.

In embodiments, the pre-clean process may be performed using a hydrogen fluoride (HF) based wet clean process.

In an embodiment the pre-clean process or cleaning process includes placing the structure of FIG. 1 in a chamber. Energy is applied to a gas such a hydrogen or a noble gas such as argon, neon or helium within the chamber to create a plasma or sputter etch. The pressure within the substrate chamber may be between about 0.3 mTorr and about 1 Torr, between about 1 mTorr and about 300 mTorr or between about 3 mTorr and about 200 mTorr, according to embodiments. The pre-clean or cleaning process removes unwanted residues from the exposed surfaces. After the pre-clean process, the structure of FIG. 1 is subjected to a nitridation process or surface modification of surfaces of opening(s). In embodiments, when plasma cleaning is used, the chamber used for the pre-clean process can also be used for the nitridation process and subsequent cleaning.

Figure 2:
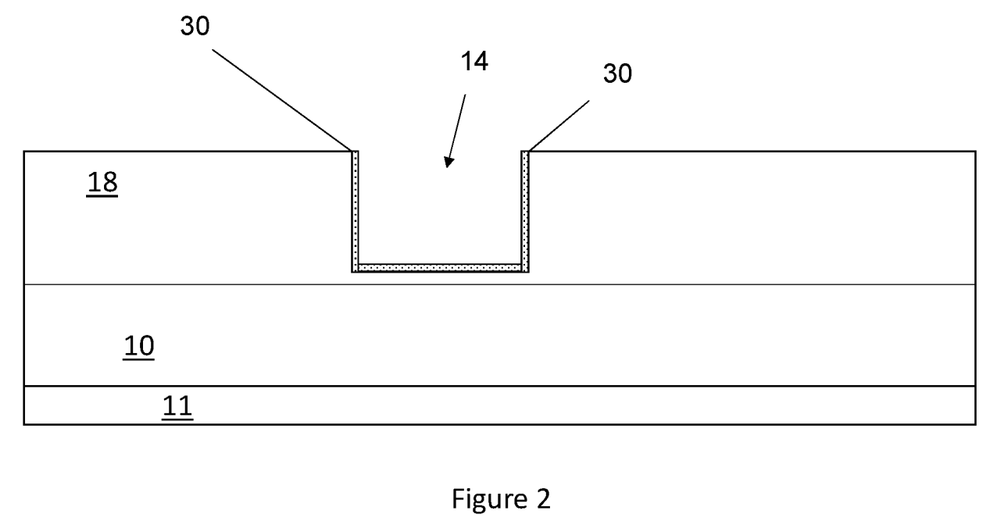
FIG. 2 illustrates a cross-sectional view of embodiments of a method for forming the electronic device shown in FIG. 4.

Referring now to FIG. 2, there is illustrated the structure of FIG. 1 after performing a surface modification process. The surface modification densifies and treats the dielectric surface of opening(s) 14. In embodiments, the surface modification may be silylation of the surface. An agent that promotes a silylation reaction at the exposed surfaces dehydrates the top surfaces against future moistening. The silylation reaction introduces silyl groups, such as trimethylsilyl groups comprised of three methyl groups bonded to a silicon atom (($CH_3$)$_3$Si), at the exposed to replace the hydroxyl groups. Siloxyl groups are characterized by chemical inertness and a large molecular volume. The silylation agent may comprise, but is not limited to, hexamethyldisilazane (HMDS), which has a molecular formula of $C_6H_{19}NSi_2$. The silylation agent may be vaporized to form a vapor and caused to contact the exposed surfaces.

In embodiments the surface modification process includes a ntiridation process. The nitridation process nitridizes, any exposed surface of first dielectric material 18 forming a nitrided dielectric material surface region 30 on in the exposed surfaces of opening(s) 14. That is, the nitridation process partially coverts or entirely converts the surface atoms and residues located on the surfaces of opening(s) 14 into nitrided residues which are less conductive than their non-nitrided residue counterparts.

In accordance with embodiments of the present application, the nitrided dielectric material surface region 30 has a higher content of nitride (i.e., nitrogen) than the remaining portion of first dielectric material 18.

The term "nitrided dielectric material surface region" is used in the present application to denote a portion of the dielectric material in which nitride exposure was made. Nitrided dielectric material surface region 30 includes a nitrided dielectric material that has a higher content of nitride as compared to first dielectric material 18 and layer 10 (when a second dielectric material) which were not subjected to the nitride exposure.

In one embodiment of the present application, the nitridation process can be performed utilizing a thermal nitridation process. Thermal nitridation includes heating the structure shown in FIG. 2 in the presence of a nitrogen-containing source. The heating should be performed such that oxidation of metallic surfaces is avoided. The heating may by performed utilizing any energy source including, for example, a heating element or a lamp. In some embodiments of the present application, the heating can performed at a temperature from about 80° C. to about 400° C. In another embodiment, the heating can be performed at a temperature from about 150° C. to about 300° C. In some embodiments of the present application, the heating in the presence of a nitrogen-containing source can be performed at a single temperature. In another embodiment, the heating in the presence of a nitrogen-containing source can be performed a various temperatures using various ramp-up rates and/or soak times.

The nitrogen-containing source that can be used during thermal nitridation includes, but is not limited to, $N_2$, NO, $N_2O$, $NH_3$, $N_2H_2$ and mixtures thereof. Prior to thermal nitridation, the nitrogen-containing source can be in any form. However, during the thermal nitridation process the nitrogen-containing source is in the form of a gas or vapor. In some embodiments, the nitrogen-containing source can be used undiluted. In another embodiment of the present application, the nitrogen-containing source can be used in conjunction with an inert ambient such as, for example, He, Ar, Ne and mixtures thereof. In such an embodiment, the nitrogen-containing source and the inert ambient can be admixed prior to being used during thermal nitridation. In yet another embodiment, the nitrogen-containing source and the inert gas can be introduced as separate components into a reactor and then admixed within the reactor itself prior contacting the surface of the structure shown in FIG. 2. When a nitrogen-containing source/inert ambient mixture is employed, and in one embodiment, the concentration of nitrogen-containing source within the mixture is from about 10% to about 90%, the remainder up to 100% is the content of the inert ambient. In another embodiment, the concentration of nitrogen-containing source within the mixture is from about 40% to about 70%, the remainder up to 100% is the content of the inert ambient.

In another embodiment of the present application, the nitridation process can be performed utilizing a plasma nitridation process. Plasma nitridation includes introducing a nitrogen-containing plasma to the structure shown in FIG. 1. The nitrogen-containing plasma can be generated by introducing a nitrogen-containing source into a reactor that can generate the nitrogen-containing plasma. In some embodiments of the present application, an RF or microwave power source can be used to generate a nitrogen-containing plasma within a reactor. Plasma nitridation and plasma cleaning can be conducted in the same chamber.

After the nitridation process, the dielectric material 18 can have a nitride layer 30 (FIG. 2) of 10 to 30 angstroms (Å) thick. This nitride layer has a concentration of up to 15 weight percent nitrogen. In embodiments, the nitrogen concentration in the layer 30 is from 2 weight percent nitrogen to 10 weight percent nitrogen.

Figure 3:
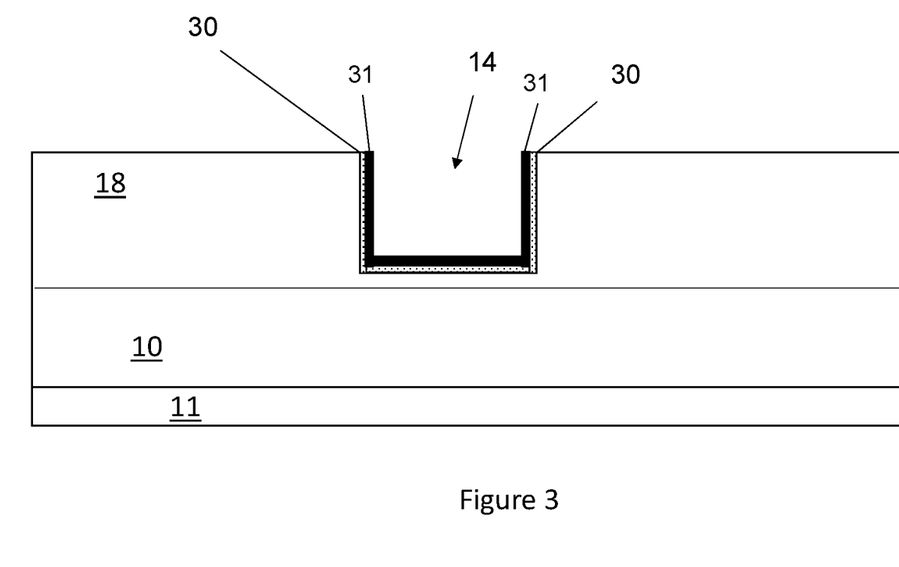
FIG. 3 illustrates a cross-sectional view of embodiments of a method for forming the electronic device shown in FIG. 4.

After surface modification, opening(s) 14 may be cleaned as discussed above. In embodiments, the cleaning process may be performed in the same chamber as the nitridation process and the pre-clean process. After cleaning, thin film deposition is conducted. This can be performed in the same chamber as the pre-clean, nitridation process and cleaning after nitridation. As shown in FIG. 3, a thin coating of tantalum (Ta), titanium (Ti), tungsten (W), cobalt (Co), ruthenium (Ru), rhodium (Rh) or copper (Cu) is deposited to form a thin metal layer 31 over the nitrided dielectric material surface region 30. Thin film deposition of the metals tantalum (Ta), titanium (Ti), tungsten (W), cobalt (Co), ruthenium (Ru), rhodium (Rh) or copper (Cu) may include chemical vapor deposition (CVD), physical vapor deposition (PVD) or atomic layer deposition (ALD).

In embodiments, tantalum (Ta) is used as the thin film deposition material. FIG. 3 shows thin metal layer 31 as tantalum surface over the nitride dielectric surface region 30. The tantalum layer can have a thickness of from 5 Å to 100 Å. In embodiments, the tantalum layer 31 can be from 10 Å to 40 Å thick, or from 10 Å to 20 Å thick.

Figure 4:
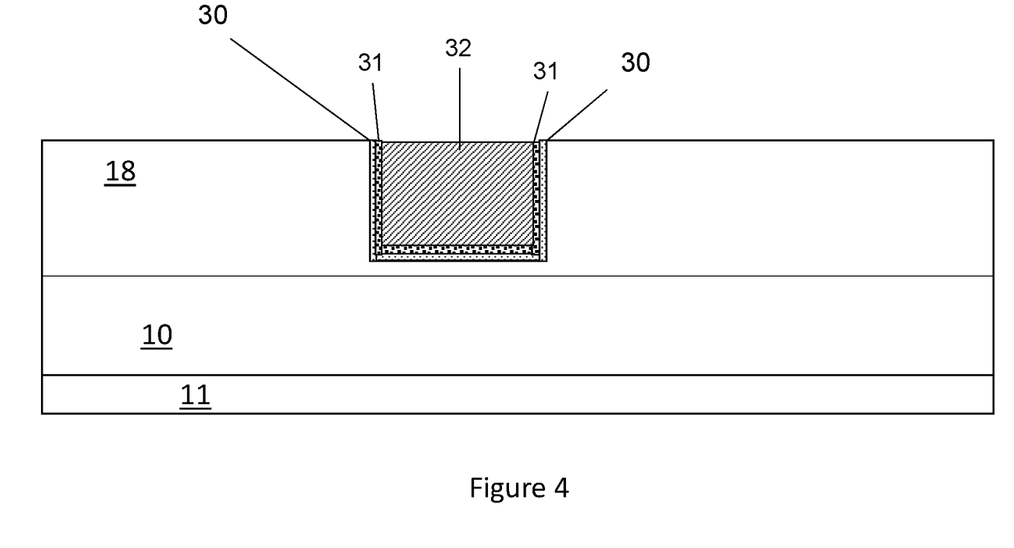
FIG. 4 illustrates cross-sectional view of an embodiment of an interconnect structure of the present disclosure.

As shown in FIG. 4, the structure of FIG. 3 is then subjected to cleaning and then to a deposition of copper 32 to fill opening(s) 14. After deposition of copper 32, the structure is planarized as is shown in FIG. 4.

An example of a copper deposition process can include any now known or later developed techniques appropriate for copper including but are not limited to, for example: chemical vapor deposition (CVD), low-pressure CVD (LP-CVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. In embodiments, non-selective sputtering (PVD) and plating, are generally used for copper deposition.

In embodiments other conductors such as aluminum, cobalt, tungsten and ruthenium can be used as alternatives to copper. The deposition of the metals is by the same processes as used for copper.

Planarization refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Nitrided surface dielectric region 30 and thin metal layer 31 has been found to perform as effectively as a tantalum nitride diffusion barrier layer. Opening(s) 14 is filled with a conductive material such as copper.

Figure 5:
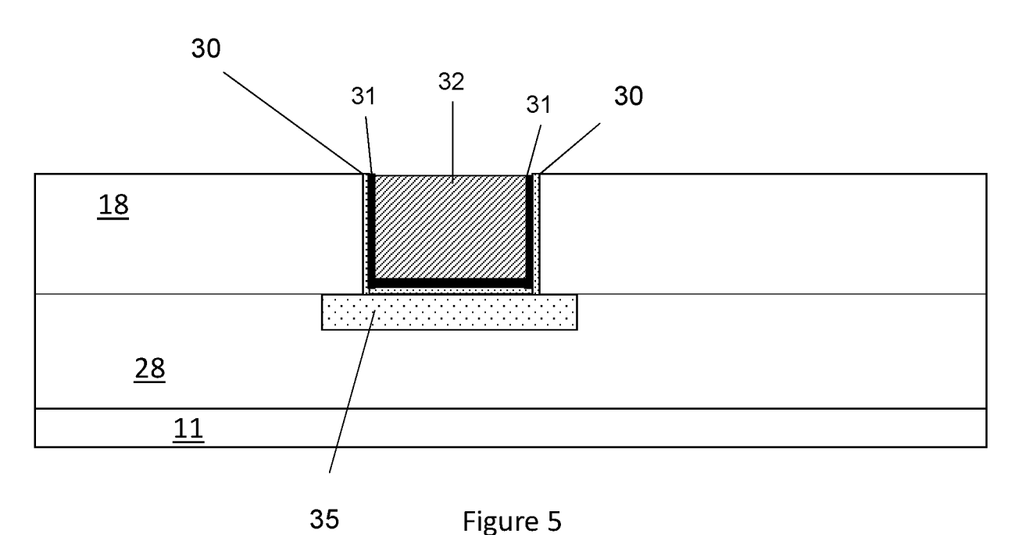
FIG. 5 illustrates cross-sectional view of another embodiment of an interconnect structure of the present disclosure.

Another embodiment of the method disclosed herein is shown in FIG. 5. FIG. 5 shows a first dielectric layer 18 disposed on a second dielectric layer 28. An electronic device 35 is disposed in the second dielectric layer 28. An upper surface of electronic device 35 is coplanar with the upper surface of second dielectric layer 28. After etching an opening in dielectric layer 18 to expose a surface of the electronic structure, the opening is subjected to a nitridization process as described above to form nitrided dielectric material surface region 30 in the opening. A thin metal layer 31 of tantalum is deposited and then the opening is filled with copper 32 and planarized.

Electronic device(s) 35 can be active or passive. An active device can be a transistor, e.g., field effect transistor (FET); whereas, a passive device can be a wiring structure, resistor, capacitor, diode inductor or varactor etc., all of which are fabricated in a conventional manner such that further explanation is not required for an understanding of the disclosure.

Figure 6:
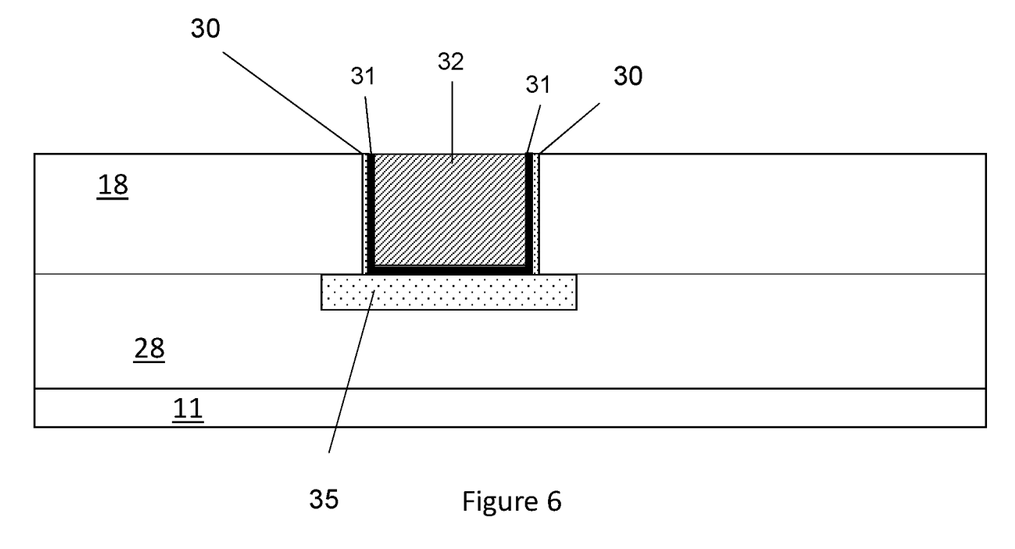
FIG. 6 illustrates cross-sectional view of another embodiment of an interconnect structure of the present disclosure.

Another embodiment of the method disclosed herein is shown in FIG. 6. FIG. 6 shows a first dielectric layer 18 disposed on a second dielectric layer 28. An electronic device 35 is disposed in the second dielectric layer 28. An upper surface of electronic device 35 is coplanar with the upper surface of second dielectric layer 28. After etching an opening in dielectric layer 18 to expose a surface of the electronic structure, the opening is subjected to a nitridization process as described above to form nitrided dielectric material surface region 30 in the opening. A plasma cleaning process described above removes the nitride surface on the electronic device 35. This removal is easily accomplished if the electronic device is a metal as the nitridation process does not impact metals as it does dielectric materials. A thin metal layer 31 of tantalum is deposited and then the opening is filled with copper 32 and planarized. The tantalum directly contacts the electronic device 35.

In the embodiment shown in FIG. 6, the performance of the device is improved over structures using TaN as a diffusion barrier in on the sides and bottom of the opening. This is due to the fact that tantalum has a lower resistance than TaN. As the openings for vias and wires become smaller, the impact of the resistance from the diffusion barrier between the electronic device 35 and the copper 32 becomes a bigger factor. By using tantalum 31 directly contacting the copper and electronic device, resistance is reduced. The nitride layer 30 and tantalum layer 31 on the sides of the opening perform suitably as a diffusion barrier.

The resulting IC structures described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

We claim:

1. A method of forming a semiconductor interconnect structure comprising:
   etching an opening in a first interconnect dielectric material;
   performing a nitridation process that converts surfaces of the opening of the first interconnect dielectric material into nitrided residues, and forms a nitrided interconnect dielectric material surface in the opening, wherein the nitrided interconnect dielectric material has a nitrogen content of from 2 weight percent nitrogen to 10 weight percent nitrogen;
   depositing tantalum to create a tantalum layer directly on the nitrided interconnect dielectric material surface;
   depositing copper to fill the opening, such that the tantalum layer is interposed directly between the nitride interconnect dielectric material and the deposited copper; and
   planarizing a surface of the first interconnect dielectric material.

2. The method of claim 1, wherein performing the nitridation process comprises a thermal nitridation process.

3. The method of claim 2, wherein the thermal nitridation process includes heating the semiconductor interconnect structure to a temperature from about 80° C. to about 400° C.

4. The method of claim 1, further comprising cleaning the opening prior to performing the nitridation process.

5. The method of claim 4, wherein the cleaning and performing the nitridation process are carried out in a single chamber.

6. The method of claim 1, further comprising cleaning the opening after performing the nitridation process.

7. The method of claim 6, wherein the performing the nitridation process and cleaning are carried out in a single chamber.

8. The method of claim 1, wherein performing the nitridation process comprises performing a plasma nitridation process.

9. The method of claim 1, wherein the first interconnect dielectric material is disposed on a second interconnect dielectric material, the second interconnect dielectric material having at least one electronic device having an upper surface that is coplanar with an upper surface of the second interconnect dielectric material.

10. The method of claim 9, wherein the opening exposes a portion of an upper surface of the at least one electronic device.

11. The method of claim 9, wherein the at least one electronic device comprises a capacitor, a diode, a resistor, a wiring structure, a transistor, an inductor or a varactor.

12. The method of claim 1, wherein the first interconnect dielectric material layer is selected from the group consisting of: silicon nitride (Si3N4), silicon oxide (SiO2), fluorinated SiO2 (FSG), hydrogenated silicon oxycarbide (Si-COH), porous SiCOH, boro-phospho-silicate glass (BPSG), silsesquioxanes, carbon (C) doped oxides and thermosetting polyarylene ethers.

13. An interconnect structure comprising:
   an interconnect dielectric material over a substrate;
   at least one trench formed in the interconnect dielectric material;
   a nitride layer disposed on sidewalls and bottom surface of the at least one trench wherein the nitride layer comprises a nitrided interconnect dielectric material having a nitrogen content of from 2 weight percent nitrogen to 10 weight percent nitrogen;
   a metal film disposed directly on the nitride layer; and
   a conductive wire filling the at least one trench, wherein the metal film is interposed directly between the nitride layer and the conductive wire.

14. The interconnect structure of claim 13, wherein the nitride layer has a thickness of from about 10 angstroms to 30 angstroms.

15. The interconnect structure of claim 13, wherein the metal film comprises a pure metal selected from the group consisting of tantalum (Ta), titanium (Ti), tungsten (W), cobalt (Co), ruthenium (Ru), rhodium (Rh) and copper (Cu).

16. The interconnect structure of claim 13, wherein the metal film has a thickness of from about 10 angstroms to 20 angstroms.

17. The interconnect structure of claim 13, wherein the conductive wire is a material selected from aluminum, cobalt, tungsten, ruthenium and copper.

18. An interconnect structure comprising:
   an interconnect dielectric material over a substrate, the substrate having an electronic device disposed therein;

at least one trench formed in the interconnect dielectric material, the trench exposing a surface of the electronic device;
a nitride layer disposed on sidewalls of the trench wherein the nitride layer comprises a nitrided interconnect dielectric material having a nitrogen content of from 2 weight percent nitrogen to 10 weight percent nitrogen;
a tantalum layer disposed directly on the nitride layer and the surface of the electronic device, wherein the tantalum layer has a thickness of from about 10 angstroms to about 20 angstroms; and
a copper wire filling the at least one trench, wherein the tantalum layer is interposed directly between the nitride layer and the conductive wire.

19. The method of claim 1, further comprising, after forming the opening, performing a silyation process to form a dense and dehydrated interconnect dielectric material surface in the opening.

20. The interconnect structure of claim 18, wherein the interconnect dielectric material has a dielectric constant of at most about 2.8.

\* \* \* \* \*